US009634291B2

(12) United States Patent
Kim et al.

(10) Patent No.: US 9,634,291 B2
(45) Date of Patent: Apr. 25, 2017

(54) ORGANIC LIGHT-EMITTING TRANSISTOR (71) Applicant: Samsung Display Co., Ltd., Yongin, Gyeonggi-Do (KR)

(72) Inventors: Ki-Seo Kim, Yongin (KR); Sung-Kook Park, Yongin (KR); Seung-Chan Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/511,457

(22) Filed: Oct. 10, 2014

(65) Prior Publication Data

US 2015/0357603 A1 Dec. 10, 2015

(30) Foreign Application Priority Data

Jun. 5, 2014 (KR) .................. 10-2014-0068586

(51) Int. Cl.
*H01L 51/52* (2006.01)
*H01L 51/05* (2006.01)

(52) U.S. Cl.
CPC ...... *H01L 51/5296* (2013.01); *H01L 51/0562* (2013.01)

(58) Field of Classification Search
USPC .......................................................... 257/79
See application file for complete search history.

(56) References Cited

U.S. PATENT DOCUMENTS 5,160,985 A 11/1992 Akiyama
7,825,415 B2* 11/2010 Kim .................. H01L 27/1214
257/347
8,158,970 B2* 4/2012 Obata ................ H01L 51/0541
257/40
8,309,963 B2 11/2012 Obata et al.
2002/0167280 A1* 11/2002 Hayashi ............. H01L 51/5221
315/169.3
2012/0146011 A1 6/2012 Nakayama et al.
(Continued)

FOREIGN PATENT DOCUMENTS

JP 2787921 B1 8/1998
JP 2007-157871 A 6/2007
KR 10-2006-0003633 A 1/2006
(Continued)

OTHER PUBLICATIONS

Rinzler et al. "High Performance devices using organic semiconductors" , SPIE, 2011, pp. 1-3.*
(Continued)

*Primary Examiner* — Telly Green
(74) *Attorney, Agent, or Firm* — Knobbe Martens Olson & Bear LLP (57) ABSTRACT

An organic light-emitting transistor (OLET) is provided. The OLET includes: a substrate; at least one first electrode on the substrate; a first semiconductor layer having a first conductive type on the first electrode; a second semiconductor layer having a second conductive type on the first semiconductor layer; a gate electrode disposed on a side surface of the second semiconductor layer; a gate insulating layer disposed between the gate electrode and the second semiconductor layer; an organic emission layer on the second semiconductor layer.

19 Claims, 3 Drawing Sheets (56) References Cited

U.S. PATENT DOCUMENTS

2014/0043307 A1    2/2014  Choi et al.
2014/0054613 A1*  2/2014  Facchetti ............ H01L 51/5203
                                                                                          257/79

FOREIGN PATENT DOCUMENTS

| KR | 10-2012-0065378 A | 6/2012 |
| KR | 10-2014-0019698 A | 2/2014 |

OTHER PUBLICATIONS

Xu et al. "Vertical organic light emitting transistor" AIP, Aug. 30, 2007, pp. 092911-1 through 092911-3.*
Chae-Hwi Kim, "Insulated Gate Bipolar Transistor", Golden Bell Publisher, Sep. 5, 2012—3 pages.

* cited by examiner

ORGANIC LIGHT-EMITTING TRANSISTOR

RELATED APPLICATION

This application claims the benefit of Korean Patent Application No. 10-2014-0068586, filed on Jun. 5, 2014, in the Korean Intellectual Property Office, the disclosure of which is incorporated herein in its entirety by reference.

BACKGROUND

1. Field

One or more embodiments of the present invention relate to an organic light-emitting transistor.

2. Description of the Related Art

An organic light-emitting device (OLED) is a self-emitting type device including a hole injection electrode, an electron injection electrode, and an organic emission layer formed between the hole injection electrode and electron injection electrode, wherein excitons, which are generated by holes injected from the hole injection electrode and electrons injected from the electron injection electrode being united in the organic emission layer, emit light by falling from an excited state to a ground state. Such an OLED is applied to various fields, such as display apparatuses, and is used conjointly with transistors for driving the OLED.

An organic light-emitting transistor (OLET) is a device having functions of both the OLED and the transistor. In general, the OLET adopts a conductive channel structure of the transistor and is based on the light-emitting mechanism of the OLED, which is by the unification of holes and electrons. Accordingly, the OLET may be useful for both basic research of an organic electronic material and device and development of technical applications. The OLET is a highly integrated device which may control light-emitting, and thus, the OLET may be implemented for the development of an active matrix display and a variable organic laser device.

SUMMARY

One or more embodiments of the present invention include an organic light-emitting transistor (OLET).

Additional aspects will be set forth in part in the description which follows and, in part, will be apparent from the description, or may be learned by practice of the presented embodiments.

One aspect of the invention provides an organic light-emitting transistor (OLET) comprising: a substrate comprising a major surface; a gate electrode formed over the major surface; a gate insulating layer formed over the gate electrode; a first electrode formed over the major surface of the substrate; a first semiconductor layer formed over the first electrode and having a first conductive type; a second semiconductor layer formed over the first semiconductor layer and having a second conductive type; an organic light emission layer formed over the second semiconductor layer and further over the gate insulating layer; and a second electrode formed over the organic light emission layer, wherein, in an imaginary plane perpendicular to the major surface, the second semiconductor layer comprises an end portion contacting the gate insulating layer and configured to form a conductive channel therethrough between the first electrode and the organic light emission layer upon application of sufficient electric voltage to the gate electrode.

In the foregoing OLET, the OLET may further comprise a third semiconductor layer formed over the second semiconductor layer and having the first conductive type. The third semiconductor layer may comprise a portion overlapping the gate electrode when viewed in a direction perpendicular to the major surface. The organic light emission layer may overlap a portion of the third semiconductor layer when viewed in a direction perpendicular to the major surface, and wherein the second electrode comprises a portion overlapping the organic light emission layer when viewed in the direction and another portion contacting the third semiconductor layer. The first semiconductor layer may have a charge carrier concentration higher than that of the third semiconductor layer.

Still in the foregoing OLET, the organic light emission layer may be disposed to overlap the first electrode and the gate electrode when viewed in a direction perpendicular to the major surface. The organic light emission layer may be disposed over the gate insulating layer to overlap at least a portion of the gate electrode when viewed in a direction perpendicular to the major surface. The OLET may further comprise at least one selected from a hole injection layer having the first conductive type and a hole transport layer having the first conductive type formed over the second semiconductor layer. In the imaginary plane, the OLET may further comprise an additional first electrode, wherein the gate electrode is disposed between the first electrode and the other electrode.

Yet in the foregoing OLET, upon application of sufficient electric voltage to the gate electrode, the conductive channel may be formed through the end portion and the organic light emission layer between the first electrode and the second electrode. At least one selected from the first semiconductor layer and the second semiconductor layer may comprise an inorganic semiconductor. At least one selected from the first semiconductor layer and the second semiconductor layer may comprise an organic semiconductor.

Further in the foregoing OLET, the first electrode surrounds the gate electrode when viewed in a direction perpendicular to the major surface. The OLET may further comprise a third semiconductor layer formed over the second semiconductor layer and having the first conductive type, wherein the third semiconductor layer comprises a portion overlapping the gate electrode when viewed in a direction perpendicular to the major surface, wherein upon application of sufficient electric voltage to the gate electrode, the conductive channel is formed through the end portion of the second semiconductor layer and the overlapping portion of the third semiconductor layer between the first electrode and the organic light emission layer.

Another aspect of the invention provides an OLET display comprising an array of pixels, each of the pixels comprising the foregoing OLET.

A further aspect of the invention provides an organic light-emitting transistor (OLET) comprising: a gate electrode over a major surface of a substrate; a gate insulating layer formed over the gate electrode; a first electrode disposed over the major surface of the substrate and formed apart from the gate electrode when viewed in a direction perpendicular to the major surface; a first semiconductor layer and a second semiconductor layer sequentially stacked over the first electrode; an organic light emission layer formed over the gate insulating layer and further over the second semiconductor layer; and a second electrode formed over the organic light emission layer, wherein, in an imaginary plane perpendicular to the major surface, the first and second semiconductor layers respectively comprise first and second end portions contacting the gate insulating layer and configured to form a conductive channel between the first electrode and the organic light emission layer upon application of sufficient electric voltage to the gate electrode.

In the foregoing OLET, the OLET may further comprise a third semiconductor layer formed over the second semiconductor layer, and wherein the first semiconductor layer and the third semiconductor layer comprise a first conductive type semiconductor, and the second semiconductor layer comprises a second conductive type semiconductor. The third semiconductor layer may be an inorganic semiconductor. The third semiconductor layer may be an organic semiconductor. The OLET may further comprise a third semiconductor layer formed over the second semiconductor layer and comprising a portion overlapping the gate electrode when viewed in a direction perpendicular to the major surface, wherein upon application of sufficient electric voltage to the gate electrode, the conductive channel is formed through the first and second end portions and the overlapping portion of the third semiconductor layer between the first electrode and the organic light emission layer.

According to one or more embodiments of the present invention, an organic light-emitting transistor (OLET) includes: a substrate; at least one first electrode on the substrate; a first semiconductor layer having a first conductive type on the first electrode; a second semiconductor layer having a second conductive type on the first semiconductor layer; a gate electrode disposed on a side of the second semiconductor layer; a gate insulating layer disposed between the gate electrode and the second semiconductor layer; an organic emission layer on the second semiconductor layer; and a second electrode on the organic emission layer.

The OLET may further include a third semiconductor layer having the first conductive type on the second semiconductor layer.

The gate insulating layer may be disposed on an upper surface and a side surface of the gate electrode, and the third semiconductor layer may extend toward an upper surface of the gate insulating layer to be disposed to overlap the gate electrode.

The organic emission layer may overlap a portion of the third semiconductor layer, and the second electrode may extend from an upper surface of the organic emission layer to contact an upper surface of the third semiconductor layer.

The first semiconductor layer may be a higher concentration conductive type than the third semiconductor layer.

The organic emission layer may be disposed to overlap the first electrode and the gate electrode.

The gate insulating layer may be disposed on an upper surface and a side surface of the gate electrode, and the organic emission layer may be disposed on the gate insulating layer to overlap at least a portion of the gate electrode.

The OLET may further include on the second semiconductor layer at least one selected from a hole injection layer having the first conductive type and a hole transport layer having the first conductive type.

There may be a plurality of first electrodes and the plurality of first electrodes may be arranged with the gate electrode between each pair of the first electrodes.

A channel may be formed in the first semiconductor layer and the second semiconductor layer according to a potential of the gate electrode.

At least one selected from the first semiconductor layer and the second semiconductor layer may include an inorganic semiconductor.

At least one selected from the first semiconductor layer and the second semiconductor layer may include an organic semiconductor.

According to one or more embodiments of the present invention, an organic light-emitting transistor (OLET) includes: a gate electrode on a substrate; a gate insulating layer formed on an upper surface and a side surface of the gate electrode; at least one first electrode disposed on the substrate and formed apart from the gate electrode; a first semiconductor layer and a second semiconductor layer sequentially stacked on the first electrode; an organic emission layer overlapping the gate electrode and arranged on the gate insulating layer and the second semiconductor layer; and a second electrode on the organic emission layer, wherein the gate electrode is disposed on a side of the first semiconductor layer and a side of the second semiconductor layer.

The OLET may further include a third semiconductor layer on the second semiconductor layer. The first semiconductor layer and the third semiconductor layer may include a first conductive type semiconductor, and the second semiconductor layer may include a second conductive type semiconductor.

The third semiconductor layer may be an inorganic semiconductor or an organic semiconductor.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

Figure 1:
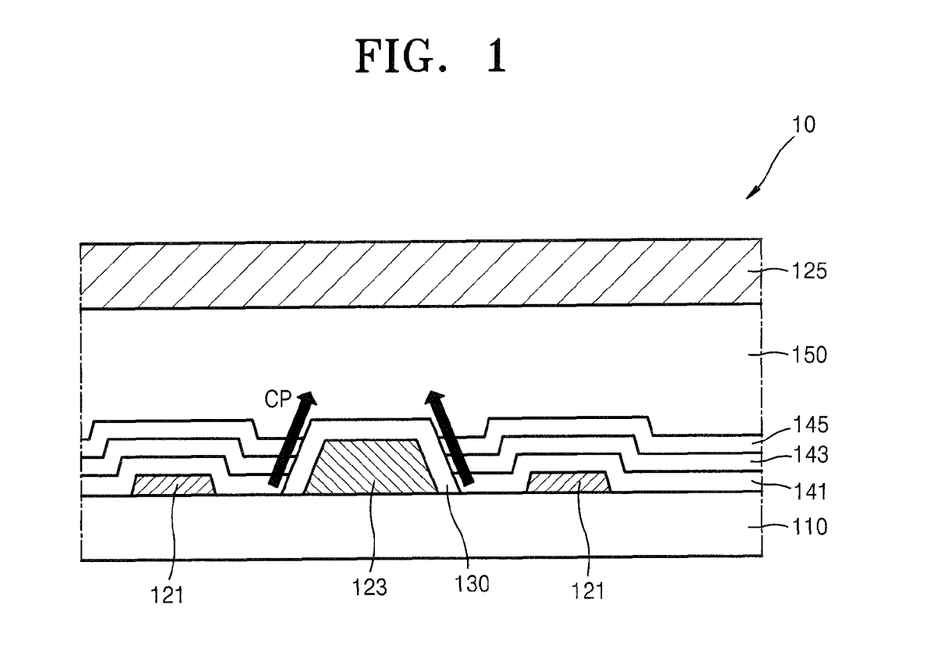
FIG. 1 is a cross-sectional view of an organic light-emitting transistor (OLET) according to an embodiment of the present invention.

FIG. 1 is a cross-sectional view of an organic light-emitting transistor (OLET) 10 according to an embodiment of the present invention.

Referring to FIG. 1, the OLET 10 includes a substrate 110, a first electrode 121, a second electrode 125, a gate electrode 123, a gate insulating layer 130, a first semiconductor layer 141, a second semiconductor layer 143, and an intermediate layer 150 including an organic emission layer. The OLET 10 may further include a third semiconductor layer 145.

At least one first electrode 121 is disposed on the substrate 110 and the second electrode 125 is disposed to face the first electrode 121 with the first semiconductor layer 141, the second semiconductor layer 143, the third semiconductor layer 145, and the intermediate layer 150 therebetween.

The first semiconductor layer 141 includes a first conductive type semiconductor. The first conductive type semiconductor may be an n-type or p-type semiconductor. The second semiconductor layer 143 includes a second conductive type semiconductor which is different from the first conductive type semiconductor. That is, when the first semiconductor layer 141 includes the p-type semiconductor, the second semiconductor layer 143 includes the n-type semiconductor. The third semiconductor layer 145 includes the first conductive type semiconductor.

Accordingly, the first semiconductor layer 141, the second semiconductor layer 143, and the third semiconductor layer 145 form an n-p-n junction structure or a p-n-p junction structure. That is, the junction structure of the first semiconductor layer 141, the second semiconductor layer 143, and the third semiconductor layer 145 may be a structure in which a forward-biased junction structure and a reverse-biased junction structure coexist.

The gate electrode 123 is disposed over a side surface of the second semiconductor layer 143 with the gate insulating layer 130 therebetween. In the illustrated sectional view, an end portion of the second semiconductor layer contacts the gate insulating layer 130, and is located adjacent the gate electrode in which the gate insulating layer is interposed between the gate electrode and the end portion of the second semiconductor layer. This may be in order to adjust the potential of the gate electrode 123, thereby making carriers of the second semiconductor layer move. Further in the illustrated sectional view of FIG. 1, an end portion of the first semiconductor layer contacts the gate insulating layer 130, and is located adjacent the gate electrode in which the gate insulating layer is interposed between the gate electrode and the end portion of the first semiconductor layer. Additionally, in the illustrated sectional view of FIG. 1, an end portion of the third semiconductor layer contacts the gate insulating layer 130, and is located adjacent the gate electrode in which the gate insulating layer is interposed between the gate electrode and the end portion of the third semiconductor layer.

The intermediate layer 150 includes the organic emission layer EML, and, in addition to this, may further include at least one selected from a hole injection layer HIL, a hole transport layer HTL, an electron transport layer ETL, and an electron injection layer EIL. The intermediate layer 150 according to the present embodiment is not limited thereto. The intermediate layer 150 may include the organic emission layer EML and may further include various other function layers.

With regard to an operation of the OLET 10, a case where the second semiconductor layer 143 includes the n-type semiconductor will be exemplified.

In this case, the first semiconductor layer 141, the second semiconductor layer 143, and the third semiconductor layer 145 have the forward-biased junction structure and the reverse-biased junction structure coexisting as the p-n-p junction structure. Thus, even if voltage is applied between the first electrode 121 and the second electrode 125, the OLET 10 remains off.

Here, when a negative (−) voltage is applied to the gate electrode 123, a hole, which is a minority carrier of the second semiconductor layer 143, is drawn toward the gate electrode 123. Accordingly, a channel may be formed on the first semiconductor layer 141, the second semiconductor layer 143, and the third semiconductor layer 145. Accordingly, the hole is injected into the intermediate layer 150 along a carrier path CP. In the illustrated sectional view of FIG. 1, a conductive channel may be formed through the end portions of the first, second and third semiconductor layers that contact the gate insulating layer.

In the organic emission layer EML included in the intermediate layer 150, exitons, which are generated when holes injected as the channel is formed and electrons injected from the second electrode 125 are combined, emit light by falling from an excited state to a ground state. In this way, according to the potential of the gate electrode 123, the "on" status of the OLET 10 may be controlled.

Hereinafter, a more detailed structure of the OLET 10 will be described.

The substrate 110 may be formed of a glass, plastic, or metal material. The substrate 110 may be flexible.

A buffer layer (not shown) may be formed on the substrate 110. The buffer layer may provide a planarization surface on the substrate 110 and contain an insulating material to prevent or reduce penetration of water and impurities onto the substrate 110. The buffer layer may be omitted according to necessity.

At least one first electrode 121 may be disposed on the substrate 110. There may be a plurality of first electrodes 121 and the plurality of first electrodes 121 may be arranged with the gate electrode 123 between each pair of the first electrodes 121. The first electrode 121 may function as a source electrode or a drain electrode.

In alternative embodiments, the first electrode may have a ring shape, for example, annular ring shape, and surround the gate electrode located in the center of the ring shape when viewed in a direction perpendicular to a major surface of the first electrode 110. The gate electrode may have a circular shape or polygonal shape when viewed in the direction.

The second electrode 125 is disposed to face the first electrode 121 with the first semiconductor layer 141, the second semiconductor layer 143, the third semiconductor layer 145, and the intermediate layer 150 therebetween. One selected from the first electrode 121 and the second electrode 125 may function as the source electrode and the other may function as the drain electrode.

The first electrode 121 and the second electrode 125 may be formed of various conductive materials. For example, the first electrode 121 and/or the second electrode 125 may be formed of a metal or transparent conductive oxide. In some embodiments, the first electrode 121 and/or the second electrode 125 may be formed of aluminum (Al), an Al alloy, tungsten (W), copper (Cu), nickel (Ni), chrome (Cr), molybdenum (Mo), titanium (Ti), platinum (Pt), tantalum (Ta), indium tin oxide (ITO), indium zinc oxide (IZO), or a combination thereof. The first electrode 121 and/or the second electrode 125 may be formed as a single layer or multiple layers. In some embodiments, the first electrode 121 and/or the second electrode 125 may have a stack of Ti/Au, Ni/Ag, Ni/Au, Ti/Cu, Mo/Al/Mo, or Ti/Al/Ti.

The first electrode 121 and/or the second electrode 125 may be formed as a transparent electrode or a reflective electrode. When the first electrode 121 and/or the second electrode 125 are/is formed as the transparent electrode, the first electrode 121 and/or the second electrode 125 may be formed of ITO, IZO, ZnO, or $In_2O_3$. When the first electrode 121 and/or the second electrode 125 are/is formed as the reflective electrode, the first electrode 121 and/or the second electrode 125 may include a reflective layer formed of Ag, Mg, Al, Pt, Pd, Au, Ni, Nd, Ir, Cr, or a combination thereof and a transparent layer formed of ITO, IZO, ZnO, or $In_2O_3$.

The first semiconductor layer 141, the second semiconductor layer 143, and the third semiconductor layer 145 may be sequentially stacked on the first electrode 121. The first semiconductor layer 141 and the third semiconductor layer 145 include the first conductive type semiconductor and the second semiconductor layer 143 includes the second conductive type semiconductor, which is different from the first conductive type semiconductor. For example, when the first semiconductor layer 141 and the third semiconductor layer 145 are the p-type semiconductors, the second semiconductor layer 143 may be the n-type semiconductor.

The first semiconductor layer 141 may have a higher charge carrier concentration than the third semiconductor layer 145. For example, the first semiconductor layer 141 may be a p+-type semiconductor and the third semiconductor layer 145 may be a p-type semiconductor which has a mobile hole concentration smaller than the p+-type semiconductor. This may be a way to increase efficiency of a device by adjusting mobility of holes.

Here, the third semiconductor layer 145 may be omitted according to a material included in the intermediate layer 150. For example, when the intermediate layer 150 includes a material which has a property of the first conductive type semiconductor as the first semiconductor layer 141, the third semiconductor layer 145 may be omitted.

The first semiconductor layer 141, the second semiconductor layer 143, or the third semiconductor layer 145 may include an inorganic semiconductor, an organic semiconductor, or an organic and inorganic hybrid semiconductor.

In some embodiments, when the first semiconductor layer 141, the second semiconductor layer 143, or the third semiconductor layer 145 includes an inorganic semiconductor, the first semiconductor layer 141, the second semiconductor layer 143, or the third semiconductor layer 145 may include a semiconductor which is doped with trivalent or pentavalent impurities.

In some embodiments, when the first semiconductor layer 141, the second semiconductor layer 143, or the third semiconductor layer 145 includes the p-type organic semiconductor, the first semiconductor layer 141, the second semiconductor layer 143, or the third semiconductor layer 145 may include tetracene, pentacene, DNTT, BTBT, DATT, ADT, C8-BTBT, FTTF, DH-FTTF, BEDT-TTF, RUBRENE, or TES-ADT.

In some embodiments, when the first semiconductor layer 141, the second semiconductor layer 143, or the third semiconductor layer 145 includes the n-type organic semiconductor, the first semiconductor layer 141, the second semiconductor layer 143, or the third semiconductor layer 145 may include DBP, FULLERENE, NTCDA, PEPTC, or N,N'-Bis(2,5-di-tert-butylphenyl)-3,4,9,10-perylenedicarboximide.

The gate electrode 123 is disposed on the side surface of the second semiconductor layer 143 with the gate insulating layer 130 therebetween. The first semiconductor layer 141 and/or the third semiconductor layer 145 may be disposed on a side surface of the gate electrode 123. The gate electrode 123 may be disposed on the substrate 110 as in FIG. 1; however, it is not limited thereto. For example, another layer, such as a buffer layer, may exist between the gate electrode 123 and the substrate 110.

The gate electrode 123 may be formed of various conductive materials. For example, the gate electrode 123 may be formed of a metal or transparent conductive oxide. In some embodiments, the gate electrode 123 may be formed of Al, an Al alloy, W, Cu, Ni, Cr, Mo, Ti, Pt, Ta, ITO, IZO, or a combination thereof. The gate electrode 123 may be formed as a single layer or multiple layers. In some embodiments, the gate electrode 123 may have a stack of Ti/Au, Ni/Ag, Ni/Au, Ti/Cu, Mo/Al/Mo, or Ti/Al/Ti. The gate electrode 123 may be formed of the same material as the first electrode 121.

The gate insulating layer 130 is disposed between the gate electrode 123 and the second semiconductor layer 143. The gate insulating layer 130 may be disposed on the side surface and an upper surface of the gate electrode 123.

The gate insulating layer 130 is formed as an insulator and may electrically separate the gate electrode 123 and the second semiconductor layer 143. In some embodiments, the gate insulating layer 130 may be formed as a single layer of an inorganic material or an organic material, or a stack of the inorganic material and the organic material. In some embodiments, the gate insulating layer 130 may include silicon nitride (SiNx) and/or silicon oxide (SiOx).

The intermediate layer 150 may be formed in a channel region which is formed in the first through third semiconductor layers 141, 143, and 145 according to the potential of the gate electrode 123. In FIG. 1, the intermediate layer 150 overlaps the first electrode 121 and the gate electrode 123 and is disposed on the entire surface of the substrate 110. However, the intermediate layer 150 is not limited thereto. The intermediate layer 150 may be formed to overlap only a portion of the first through third semiconductor layers 141, 143, and 145 in which the channel region is formed. The channel region may be formed on the carrier path CP through which carriers move in the first through third semiconductor layers 141, 143, and 145 which are adjacent to the gate electrode 123.

The intermediate layer 150 may be formed of a small molecular weight or high molecular weight organic material. When the intermediate layer 150 is formed of a small molecular weight organic material, the intermediate layer 150 may be formed of a single layer or multiple layers of the hole injection layer HIL, the hole transport layer HTL, the electron transport layer ETL, and the electron injection layer EIL. The organic material that may be used may vary and may include copper phthalocyanine (CuPc), N,N-di(naphthalene-1-yl)-N,N'-diphenyl-benzidine, N,N'-di(naphthalene-1-yl)-N,N'-diphenyl-benzidine (NPB), tris-8-hydroxyquinoline aluminum (Alq3), etc. Such a small molecular weight organic material may be formed by vapor deposition by using masks.

When the intermediate layer 150 is formed of a high molecular weight organic material, the intermediate layer 150 may further include the hole transport layer HTL. Here, the hole transport layer HTL may be formed of PEDOT and the emission layer may be formed of a poly-phenylenevinylene (PPV)-based and polyfluorene-based high molecular weight organic material.

As described above, the OLET 10 may control light-emitting of the intermediate layer 150 including the organic emission layer EML and may be highly integrated.

Figure 2:
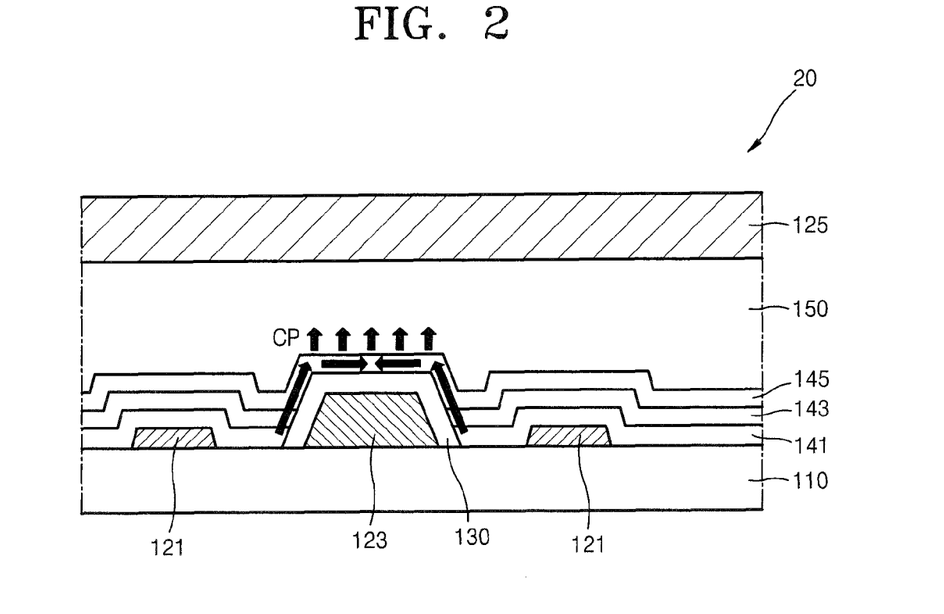
FIG. 2 is a cross-sectional view of an OLET according to another embodiment of the present invention.

FIG. 2 is a cross-sectional view of an OLET 20 according to another embodiment of the present invention. In FIG. 2, like reference numerals denote like elements in FIG. 1, and their descriptions will not be repeated for brevity of explanation.

The OLET 20 includes the substrate 110, the first electrode 121, the second electrode 125, the gate electrode 123, the gate insulating layer 130, the first semiconductor layer 141, the second semiconductor layer 143, the third semiconductor layer 145, and the intermediate layer 150 including the organic emission layer.

The third semiconductor layer 145 is disposed on the gate electrode 123 with the gate insulating layer 130 therebetween such that the third semiconductor layer 145 is interposed between the gate electrode 123 and the intermediate layer 150. The gate insulating layer 130 is disposed on an upper surface and a side surface of the gate electrode 123, thereby electrically separating the gate electrode 123 from the first through third semiconductor layers 141, 143, and 145.

The third semiconductor layer 145 is disposed on the second semiconductor layer 143 and extends toward an upper surface of the gate insulating layer 130 to be disposed to overlap the gate electrode 123.

Like shown above, when the third semiconductor layer 145 is disposed on the gate electrode 123, a channel is formed on the third semiconductor layer 145 in an upper portion of the gate electrode 123. Accordingly, a carrier path CP may be formed toward the intermediate layer 150 through the upper portion of the gate electrode 123. Along such a carrier path CP, charge diffusion and light-emitting efficiency may increase. Also, light-emitting area may increase.

Figure 3:
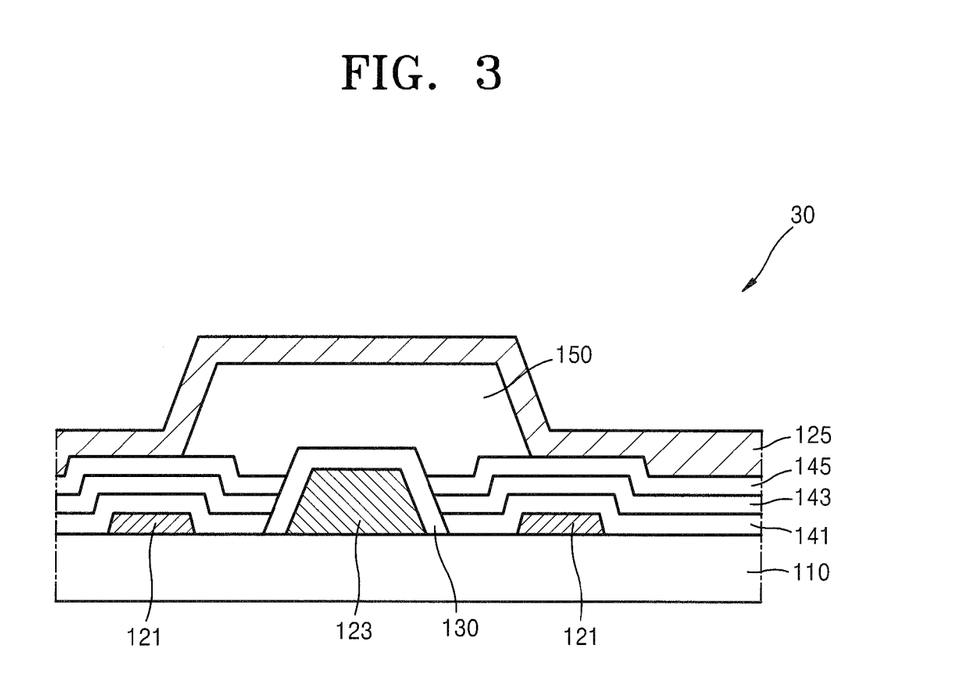
FIG. 3 is a cross-sectional view of an OLET according to another embodiment of the present invention.

FIG. 3 is a cross-sectional view of an OLET 30 according to another embodiment of the present invention. In FIG. 3, like reference numerals denote like elements in FIG. 1, and their descriptions will not be repeated for brevity of explanation.

The OLET 30 includes the substrate 110, the first electrode 121, the second electrode 125, the gate electrode 123, the gate insulating layer 130, the first semiconductor layer 141, the second semiconductor layer 143, the third semiconductor layer 145, and the intermediate layer 150 including the organic emission layer.

The intermediate layer 150 is not disposed on the entire surface of the substrate 110 and is disposed on only a portion of the substrate 110. The intermediate layer 150 is disposed to overlap a channel region formed in the first through third semiconductor layers 141, 143, and 145. The channel region may be formed on a path through which carriers move in the first through third semiconductor layers 141, 143, and 145. In embodiments, the path may be formed adjacent to the gate electrode 123. The intermediate layer 150 may be disposed to overlap a portion of the gate electrode 123. The intermediate layer 150 may be disposed to overlap a portion of the first electrode 121.

The second electrode 125 may extend from an upper surface of the intermediate layer 150 to be disposed on an upper surface of the third semiconductor layer 145 on which the intermediate layer 150 is not disposed. In this case, the first semiconductor layer 141, the second semiconductor layer 143, and the third semiconductor layer 145 may have both forward-biased junction and reverse-biased junction structures, and thus, currents may not flow between the first electrode 121 and the second electrode 125 when voltage is not applied to the gate electrode 123.

When voltage is applied to the gate electrode 123, a minority carrier of the second semiconductor layer 143 moves around the gate electrode 123, thereby forming a channel, and thus, the OLET may emit light.

In this way, the OLET 30 may control light-emitting of the intermediate layer 150 including the organic emission layer, according to the potential of the gate electrode 123, and may be highly integrated. Also, when the intermediate layer 150 is formed on only a portion of the substrate 110, a light-emitting region may be controlled.

Figure 4:
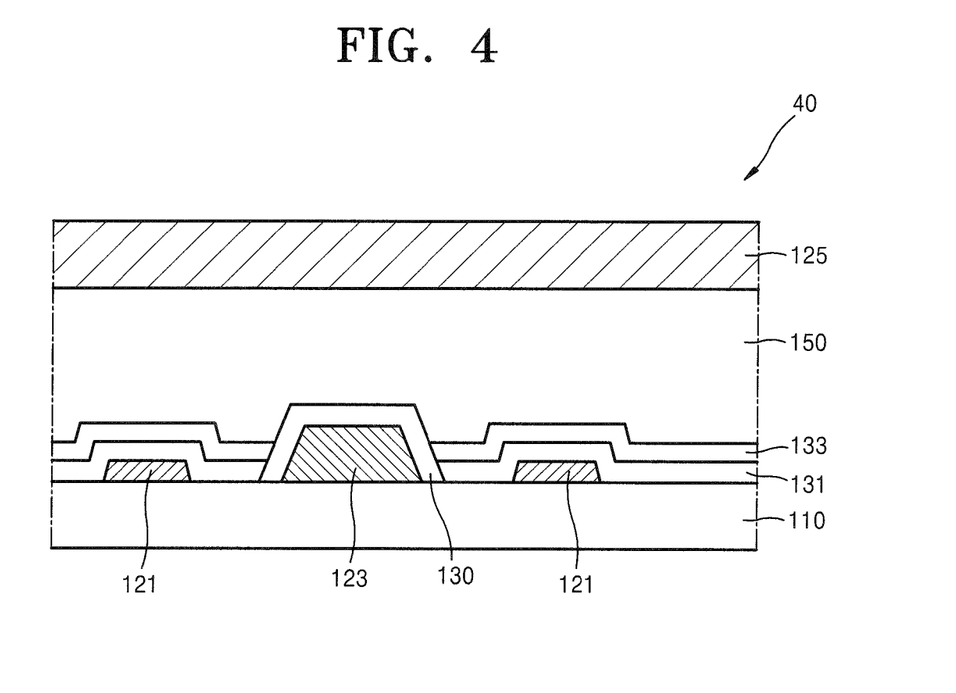
FIG. 4 is a cross-sectional view of an OLET according to another embodiment of the present invention.
Figure 5:
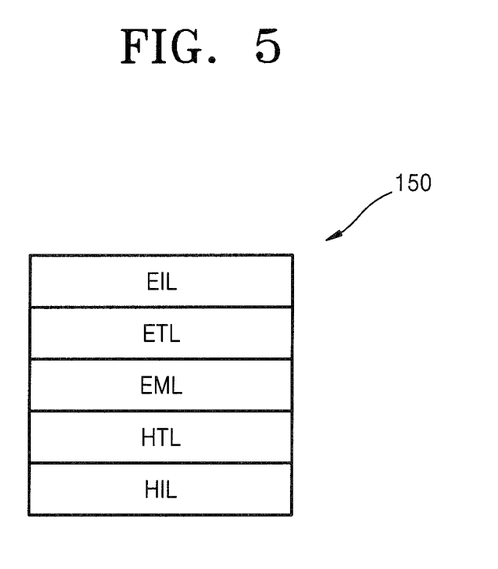
FIG. 5 is a cross-sectional view of a structure of an intermediate layer according to embodiments of the present invention.

FIG. 4 is a cross-sectional view of an OLET 40 according to another embodiment of the present invention. FIG. 5 is a cross-sectional view of the intermediate layer 150 according to the embodiments of the present invention. In FIG. 4, like reference numerals denote like elements in FIG. 1, and their descriptions will not be repeated for brevity of explanation.

Referring to FIG. 4, the OLET 40 includes the substrate 110, the first electrode 121, the second electrode 125, the gate electrode 123, the gate insulating layer 130, the first semiconductor layer 141, the second semiconductor layer 143, and the intermediate layer 150 including the organic emission layer.

Referring to FIG. 5, the intermediate layer 150 includes the organic emission layer EML, and, in addition to this, may further include at least one selected from the hole injection layer HIL, the hole transport layer HTL, the electron transport layer ETL, and the electron injection layer EIL. The intermediate layer 150 according to the present embodiment is not limited thereto. The intermediate layer 150 may include the organic emission layer EML and may further include various other function layers. An order of stacking in the intermediate layer 150 is not limited to FIG. 5. For example, the intermediate layer 150 may be stacked in an order of the electron injection layer EIL-the electron transport layer ETL-the organic emission layer EML-the hole transport layer HTL-the hole injection layer HIL, from below. Also, some of the above layers may be omitted. The order of stacking may be designed differently according to voltage applied to the first electrode 121 and the second electrode 125.

When the intermediate layer 150 includes the hole injection layer HIL or the hole transport layer HTL, the hole injection layer HIL or the hole transport layer HTL may be formed of a material having the first conductive type which is the same as the conductive type of the first semiconductor layer 141.

That is, at least one selected from the hole injection layer HIL having the first conductive type and the hole transport layer HTL having the first conductive type is included between the second semiconductor layer 143 and the organic emission layer EML. In this case, the third semiconductor layer 145 (refer to FIG. 1) may be omitted.

In some embodiments, when the first semiconductor layer 141 is a p-type semiconductor, the hole injection layer HIL or the hole transport layer HTL may be disposed between the second semiconductor layer 143 and the organic emission layer EML and may include a p-type organic semiconductor. For example, the hole injection layer or the hole transport layer may include Tetracene, Pentacene, DNTT, BTBT, DATT, HMTPD, NPD, NPB, TPD, TAPC, etc. However, it is not limited thereto. When the first semiconductor layer 141 is an n-type semiconductor, the electron injection layer EIL or the electron transport layer ETL may be disposed between the second semiconductor layer 143 and the organic emission layer EML and may include an n-type organic semiconductor.

When voltage is applied to the gate electrode 123, carriers of the second semiconductor layer 143 move around the gate electrode 123 and a channel may be formed on the hole injection layer HIL or the hole transport layer HTL. Accordingly, electrons or holes may be injected to the organic emission layer EML.

Like shown above, in the OLET 40, it is possible to control light-emitting of the intermediate layer 150 including the organic emission layer, according to the potential of the gate electrode 123, and high integration may be achieved.

An array of the OLETs 10, 20, 30, or 40 may be arranged. In this case, the array may be applied to display apparatuses.

As described above, according to the one or more of the above embodiments of the present invention, the OLETs 10, 20, 30, and 40 may control light-emitting of the intermediate layer 150 including the organic emission layer EML, according to the potential of the gate electrode 123, and may be highly integrated.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. An organic light-emitting transistor (OLET) comprising:
   a substrate comprising a surface;
   a gate electrode formed over the surface;
   a gate insulating layer formed over the gate electrode;
   a first electrode formed over the surface of the substrate;
   a first semiconductor layer formed over the first electrode and having a first doping type;
   a second semiconductor layer formed over the first semiconductor layer and having a second doping type;
   an organic light emission layer formed over the second semiconductor layer and further over the gate insulating layer; and
   a second electrode formed over the organic light emission layer,
   wherein, in a cross-section taken by an imaginary plane perpendicular to the surface, the second semiconductor layer comprises an end portion directly contacting the gate insulating layer such that the end portion of the second semiconductor layer provides a conductive channel therethrough between the first electrode and the organic light emission layer upon application of sufficient electric voltage to the gate electrode.

2. The OLET of claim 1, further comprising a third semiconductor layer formed over the second semiconductor layer and having the first doping type.

3. The OLET of claim 2, wherein the third semiconductor layer comprises a portion overlapping the gate electrode when viewed in a direction perpendicular to the surface.

4. The OLET of claim 2, wherein the organic light emission layer overlaps a portion of the third semiconductor layer when viewed in a direction perpendicular to the surface, and
   wherein the second electrode comprises a portion overlapping the organic light emission layer when viewed in the direction and another portion directly contacting the third semiconductor layer.

5. The OLET of claim 2, wherein the first semiconductor layer has a charge carrier concentration higher than that of the third semiconductor layer.

6. The OLET of claim 1, wherein the organic light emission layer is disposed to overlap the first electrode and the gate electrode when viewed in a direction perpendicular to the surface.

7. The OLET of claim 1, wherein the organic light emission layer is disposed over the gate insulating layer to overlap at least a portion of the gate electrode when viewed in a direction perpendicular to the surface.

8. The OLET of claim 1, further comprising at least one selected from a hole injection layer having the first doping type and a hole transport layer having the first doping type formed over the second semiconductor layer.

9. The OLET of claim 1, further comprising an additional first electrode, wherein the gate electrode is disposed between the first electrode and the other electrode in the imaginary plane.

10. The OLET of claim 1, wherein upon application of sufficient electric voltage to the gate electrode, the conductive channel is formed through the end portion and the organic light emission layer between the first electrode and the second electrode.

11. The OLET of claim 1, wherein at least one selected from the first semiconductor layer and the second semiconductor layer comprises an inorganic semiconductor.

12. The OLET of claim 1, wherein at least one selected from the first semiconductor layer and the second semiconductor layer comprises an organic semiconductor.

13. The OLET of claim 1, wherein the first electrode surrounds the gate electrode when viewed in a direction perpendicular to the surface, wherein when sufficient voltage is not applied to the gate electrode, the end portion of the second semiconductor layer provides electrical insulation between the first electrode and the second electrode.

14. The OLET of claim 1, further comprising a third semiconductor layer formed over the second semiconductor layer and having the first doping type, wherein the third semiconductor layer comprises a portion overlapping the gate electrode when viewed in a direction perpendicular to the surface, wherein upon application of sufficient electric voltage to the gate electrode, the conductive channel is formed through the end portion of the second semiconductor layer and the overlapping portion of the third semiconductor layer between the first electrode and the organic light emission layer.

15. An organic light-emitting transistor (OLET) comprising:
    a gate electrode over a surface of a substrate;
    a gate insulating layer formed over the gate electrode;

a first electrode disposed over the surface of the substrate and apart from the gate electrode when viewed in a direction perpendicular to the surface;

a first semiconductor layer and a second semiconductor layer sequentially stacked over the first electrode;

an organic light emission layer formed over the gate insulating layer and further over the second semiconductor layer; and a second electrode formed over the organic light emission layer, wherein the second semiconductor layer is disposed on at least one side surface of the gate electrode and is not disposed over the top surface of the gate electrode.

16. The OLET of claim 15, further comprising a third semiconductor layer formed over the second semiconductor layer, and wherein the first semiconductor layer and the third semiconductor layer comprise a first doping type semiconductor, and the second semiconductor layer comprises a second doping type semiconductor.

17. The OLET of claim 16, wherein the third semiconductor layer is an inorganic semiconductor.

18. The OLET of claim 16, wherein the third semiconductor layer is an organic semiconductor.

19. The OLET of claim 15, further comprising a third semiconductor layer formed over the second semiconductor layer and comprising a portion overlapping the gate electrode when viewed in a direction perpendicular to the surface, wherein upon application of sufficient electric voltage to the gate electrode, a conductive channel is formed through the first and second end portions and the overlapping portion of the third semiconductor layer between the first electrode and the organic light emission layer.

* * * * *